Sept. 29, 1964 J. GRABMAIER ETAL 3,151,006

USE OF A HIGHLY PURE SEMICONDUCTOR CARRIER MATERIAL
IN A VAPOR DEPOSITION PROCESS
Filed Sept. 6, 1960

United States Patent Office 3,151,006

Patented Sept. 29, 1964

3,151,006

USE OF A HIGHLY PURE SEMICONDUCTOR CARRIER MATERIAL IN A VAPOR DEPOSITION PROCESS

Josef Grabmaier, Munich, Hans-Friedrich Quast, Freiburg im Breisgau, and Hans-Heinrich Kocher, Grafelfing, near Munich, Germany, assignors to Siemens & Halske Aktiengesellschaft Berlin and Munich, a corporation of Germany Filed Sept. 6, 1960, Ser. No. 54,021
Claims priority, application Germany Feb. 12, 1960
4 Claims. (Cl. 148—174)

Figure 1:
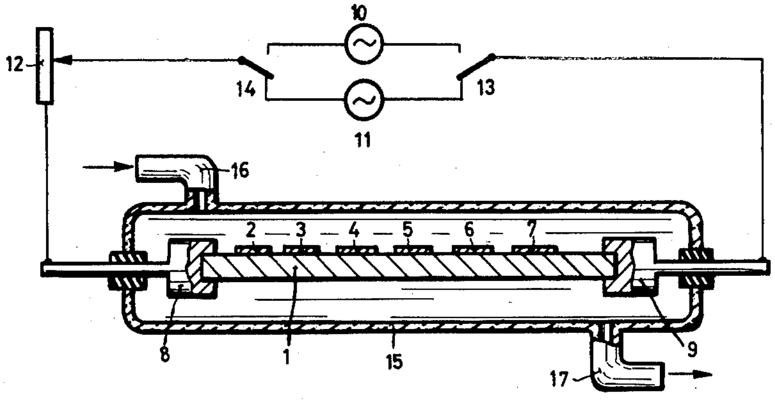

This invention is concerned with the production of a semiconductor structure by thermal decomposition of a gaseous compound of a semiconductor material and precipitation of the semiconductor material in single crystal form upon a single crystal support consisting of the same semiconductor material, in successive layers of different conductivity and/or opposite conductivity type.

In a known method of producing semiconductor layers upon a semiconductor body, a halide of the semiconductor material is in gaseous form conducted over a semiconductor body disposed in a chamber, the chamber and contents thereof being heated so as to effect the thermal decomposition of the halide. The halide thereby contains, for the production of a single crystalline layer with predetermined conductivity type, an impurity which determines the conductivity type and the conductance of the layer. This method is adapted for producing successive layers of different conductivity and/or opposite conductivity type. The conductivity of the precipitated layers can be influenced by controlling the amount of the added impurities.

It has moreover been proposed, for the precipitation of single crystalline semiconductor layers from a gas phase upon a single crystalline support, to place such support for the heating thereof to the decomposition temperature, upon a silicized metallic belt, for example, a molybdenum belt which is traversed by current, or upon a silicized board of highly pure carbon. It can hardly be avoided upon using such metal belts or carbon boards for the heating of the semiconductor supports, that strongly doping impurities vaporizing respectively from the metallic belts or from the carbon boards are built into the semiconductor incident to the precipitation of the semiconductor layers, such impurities making the precipitated single crystalline semiconductor layers low ohmic.

In order to avoid the contamination of the precipitated layer, the invention proposes a procedure according to which the single crystalline support is provided upon a carrier made of highly pure semiconductor material, such carrier being heated to raise the single crystalline support to the temperature required for the thermal decomposition of the gaseous compound of the semiconductor material.

The invention proposes, in accordance with a further feature, to use as a carrier a planed or ground semiconductor rod upon which are provided a plurality of semiconductor wafers serving as supports for the precipitation.

The carrier is thereby inductively or by direct passage of current heated to the temperature required for the decomposition.

In a preferred embodiment of the invention, single crystalline silicon layers are precipitated from a gaseous silicon compound upon a support consisting of a single crystalline silicon which is heated to decomposition temperature by heating a carrier consisting of silicon.

The procedure according to the invention is, however, also adapted for producing, for example, semiconductor layers of germanium.

The invention can be particularly advantageously applied in the production of intrinsically conductive semiconductor layers.

The various objects and features of the invention will appear from the description which will be rendered below with reference to the accompanying drawing showing in schematic representation two embodiments of the invention.

In the example illustrated in FIG. 1, there is used as a carrier a silicon rod 1 which had been highly purified by zone melting and which exhibits at least one plane surface, silicon discs or wafers 2 to 7 being placed upon such carrier. The carrier may also be in the form of a board sawed from a highly pure silicon rod or one-half of a longitudinally sawed silicon rod. The silicon carrier is at its ends provided with electrodes 8 and 9 which are connected to a current source 11. The normal voltage of the current source is due to the high degree of purity of the carrier insufficient for heating it from the room temperature to the decomposition temperature. The carrier is for this reason at the beginning of the operation connected to a high voltage source 10 by means of switches 13 and 14. The conductivity of the semiconductor material increases with increasing heating thereof and the switches 13 and 14 may be restored to the position in which they are shown so as to connect the carrier to the normal alternating current source. The current, and therewith the temperature of the carrier can be regulated inductively by means of the coil 12. The electrodes are advantageously coated with silicon so as to avoid contamination that might otherwise be caused thereby. The carrier is enclosed in a reaction vessel 15 consisting, for example, of quartz. The reaction gas mixture, for example, silicochloroform, hydrogen and if desired a gaseous compound of the doping substance, is introduced through the inlet 16, and is decomposed at the heated silicon wafers. The conductivity of the deposited or precipitated layers is influenced by controlling the amounts of impurities. Residual gases are drawn off through the outlet 17.

Figure 2:
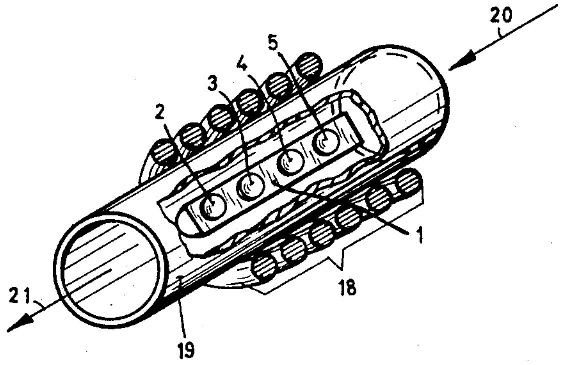

In the embodiment shown in FIG. 2, the carrier 1 which consists again, for example, of silicon, is inductively heated to the decomposition temperature by means of the coil 18. This results in the advantage of avoiding in the reaction space placement of metal parts as, for example, current terminals, from which contaminants may be vaporized during the operation. The carrier is again enclosed in a reaction vessel consisting of quartz. The reaction gas mixture is conducted over the semiconductor wafers 2–5, which are heated to the decomposition temperature, in the direction indicated by the arrows 20, 21.

The method according to the invention is particularly adapted for the production of a semiconductor structure which exhibits, for obtaining a high current combined with a high blocking voltage, between two low resistance layers of different conductivity type a thin high resistance and especially an intrinsically conductive layer.

The production of a diode will now be briefly described wherein a high resistance thin n-layer having, for example, a specific resistivity of 5,000 ohm per centimeter is by precipitation disposed between a very low resistance p-layer with a specific resistivity, for example, of 0.02 ohm, serving as a support, and a further likewise precipitated low resistance n-layer required for high current flow and having, for example, a specific resistivity of 1 ohm per centimeter.

For this purpose, a single crystalline low resistance and p-conducting support consisting, for example, of silicon, is disposed upon a highly pure silicon rod which is, for example, inductively heated and positioned in a reaction vessel made of quartz, thereby causing heating of the support to the decomposition temperature required for the single crystalline silicon precipitation and effecting in this manner separation, from the gas phase, of silicon in single crystalline form. For the production of the low resistance n-layer upon the high resistance and especially intrinsically conductive layer, doping is effected during part of the silicon separation, by means of a doping substance, for example, phosphorous, from the gas phase. The inductively heated silicon rod has a plane surface ground thereon for receiving the single crystalline silicon supports. The quartz reaction vessel as well as the induction coil can be matched to the configuration of the silicon rod.

The invention can be advantageously applied in the production of heavy duty diode rectifiers, solar elements, for the production of light and heavy duty transistors as well as for different frequency ranges, and for the production of variable capacities (varicaps) and similar structural semiconductor elements.

Changes may be made within the scope and spirit of the appended claims which define what is believed to be new and desired to have protected by Letters Patent.

We claim:

1. A method of producing a semiconductor, comprising the steps of effecting thermal decomposition of a gaseous compound of a semiconductor substance and precipitation of the separated semiconductor substance, in successive layers of predetermined conducivity and conduction type, including precipitating upon single crystal semiconductor wafers placed upon a ground plane surface of a rodlike carrier made of highly pure semiconductor material, and heating said carrier to uniformly produce upon the surface thereof, and on the respective wafers disposed thereon, the temperature required for the thermal decomposition of the gaseous compound of the semiconductor substance, and thereby effect uniform deposition of said substance upon said single crystal semiconductor wafers and removing the resulting wafers from said carrier.

2. A method according to claim 1, comprising heating said carrier to the temperature required for the decomposition by direct passage of current therethrough.

3. A method according to claim 1, comprising inductively heating said carrier to the temperature required for the decomposition.

4. A method according to claim 1, wherein single crystalline silicon layers are precipitated from a gaseous silicon compound upon a support consisting of single crystalline silicon, said support being heated to the decomposition temperature by heating a carrier therefor which consists of silicon.

References Cited in the file of this patent

UNITED STATES PATENTS

| | | |
|---|---|---|
| 2,692,839 | Christensen et al. | Oct. 26, 1954 |
| 2,763,581 | Freedman | Sept. 18, 1956 |
| 2,785,997 | Marvin | Mar. 19, 1957 |
| 2,908,871 | McKay | Oct. 13, 1959 |
| 2,958,022 | Pell | Oct. 25, 1960 |